United States Patent
Kaufman et al.

(10) Patent No.: US 6,620,037 B2
(45) Date of Patent: Sep. 16, 2003

(54) CHEMICAL MECHANICAL POLISHING SLURRY USEFUL FOR COPPER SUBSTRATES

(75) Inventors: Vlasta Brusic Kaufman, Geneva, IL (US); Rodney C. Kistler, St. Charles, IL (US); Slumin Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 10/145,357

(22) Filed: May 14, 2002

(65) Prior Publication Data

US 2002/0168923 A1 Nov. 14, 2002

Related U.S. Application Data

(63) Continuation of application No. 09/040,630, filed on Mar. 18, 1998, now Pat. No. 6,432,828.

(51) Int. Cl.$^7$ .............................. B24B 27/00; B24D 3/02
(52) U.S. Cl. .................... 451/559; 451/36; 451/41; 51/309; 106/3; 252/79.1
(58) Field of Search ............ 51/308, 309; 106/3; 216/89; 252/79.1; 438/FOR 119, 692, 693; 451/36, 41, 559

(56) References Cited

U.S. PATENT DOCUMENTS

| | | |
|---|---|---|
| 3,385,682 A | 5/1968 | Lowen |
| 4,086,176 A | 4/1978 | Ericson et al. |
| 4,671,851 A | 6/1987 | Beyer et al. |
| 4,789,648 A | 12/1988 | Chow et al. |
| 4,910,155 A | 3/1990 | Cote et al. |
| 4,944,836 A | 7/1990 | Beyer et al. |
| 4,956,313 A | 9/1990 | Cote et al. |
| 5,137,544 A | 8/1992 | Medellin |
| 5,157,876 A | 10/1992 | Medellin |
| 5,209,816 A | 5/1993 | Yu et al. |
| 5,244,523 A | 9/1993 | Tollini |
| 5,340,370 A | 8/1994 | Cadien et al. |
| 5,354,490 A | 10/1994 | Yu et al. |
| 5,391,258 A | 2/1995 | Brancaleoni et al. |
| 5,407,526 A | 4/1995 | Danielson |
| 5,476,606 A | 12/1995 | Brancaleoni et al. |
| 5,478,435 A | 12/1995 | Murphy et al. |
| 5,527,423 A | 6/1996 | Neville et al. |
| 5,575,837 A | 11/1996 | Kodama et al. |
| 5,700,383 A | 12/1997 | Fellner et al. |
| 5,735,963 A | 4/1998 | Obeng |
| 5,770,095 A | 6/1998 | Sasaki et al. |
| 5,783,489 A | 7/1998 | Kaufman et al. |
| 5,800,577 A | 9/1998 | Kido |
| 5,858,813 A | 1/1999 | Scherber |
| 5,922,091 A | 7/1999 | Tsai et al. |
| 6,063,306 A | 5/2000 | Kaufman |

FOREIGN PATENT DOCUMENTS

| | | |
|---|---|---|
| DE | 2847267 | 5/1980 |
| EP | 0 811 665 | 12/1997 |
| EP | 0 811 666 | 12/1997 |
| EP | 0 846 742 | 6/1998 |
| GB | 1198312 | 7/1970 |
| JP | 49109223 | 10/1974 |
| JP | Hei 8-83780 | 3/1995 |
| WO | WO 97/43087 | 11/1997 |
| WO | WO 97/47030 | 12/1997 |
| WO | WO 98/04646 | 2/1998 |
| WO | WO 98/23408 | 6/1998 |
| WO | WO 98/26025 | 6/1998 |

OTHER PUBLICATIONS

Carpio et al., *Journal: TSF (Thin Solid Films)*, Article: 6649, Initial Study on Copper CMP Slurry Chemistries (1995).

Hirabayashi et al., Feb. 22–23, 1996 *CMP–MIC Conference—96ISMIC—100P*, pp. 119–123, Chemical Mechanical Polishing of Copper Using a Slurry Composed of Glycine and Hydrogen Peroxide (1996).

Luo et al., Feb. 22–23, 1996 *CMP–MIC Conference—96ISMIC—100P*, pp. 145–151, Chemical–Mechanical Polishing of Copper In Acid Media (1996).

Steigerwald et al. *J. Electrom. Soc.*, vol. 142, No. 7, pp. 2379–2385, Electrochemical Potential Measurements During the Chemical–Mechanical Polishing of Copper Thin Films (1995).

Steigerwald, et al., Materials Chemistry and Physics, pp. 217–228, Chemical Processes in the chemical mechanical polishing of copper (1995).

Steigerwald, et al., Electrochemical Potential Measurements during the Chemical Mechanical Polishing of Copper Thin Films, Mat. Res. Soc. Symp. 337, 133 (1994).

*Primary Examiner*—Timothy V. Eley

(57) ABSTRACT

A chemical mechanical polishing slurry comprising an oxidizing agent, a complexing agent, an abrasive, and an optional surfactant, as well as a method for using the chemical mechanical polishing slurry to remove copper alloy, titanium, titanium nitride, tantalum and tantalum nitride containing layers from a substrate. The slurry does not include a separate film-forming agent.

28 Claims, No Drawings

CHEMICAL MECHANICAL POLISHING SLURRY USEFUL FOR COPPER SUBSTRATES

This application is a continuation of U.S. application Ser. No. 09/040,630, filed Mar. 18, 1998, now U.S. Pat. No. 6,432,828.

BACKGROUND OF THE INVENTION (1) Field of the Invention

This invention concerns a chemical mechanical polishing slurry including a complexing agent, at least one oxidizer, and at least one abrasive. The slurry is notable in that it does not include a film-forming agent. The amounts and types of oxidizers and complexing agents are selected to maximize polishing while minimizing the depth of any passivation layer on the substrate surface. The chemical mechanical polishing slurry of this invention is useful for polishing metal layers and thin-films associated with semiconductor manufacturing. More particularly this invention concerns three component chemical mechanical polishing slurries that are especially formulated to polish multiple metal layers and thin-films where one of the layers or films is comprised of copper or a copper containing alloy.

(2) Description of the Art

Integrated circuits are made up of millions of active devices formed in or on a silicon substrate. The active devices, which are initially isolated from one another, are interconnected to form functional circuits and components. The devices are interconnected through the use of well-known multilevel interconnections. Interconnection structures normally have a first layer of metallization, an interconnection layer, a second level of metallization, and sometimes a third and subsequent level of metallization. Interlevel dielectrics, such as doped and undoped silicon dioxide ($SiO_2$), are used to electrically isolate the different levels of metallization in a silicon substrate or well. The electrical connections between different interconnection levels are made through the use of metallized vias. U.S. Pat. No. 4,789,648, which is incorporated herein by reference, describes a method for preparing multiple metallized layers and metallized vias in insulator films. In a similar manner, metal contacts are used to form electrical connections between interconnection levels and devices formed in a well. The metal vias and contacts may be filled with various metals and alloys including titanium (Ti), titanium nitride (TiN), tantalum (Ta), aluminum copper (Al—Cu), aluminum silicon (Al—Si), copper (Cu), tungsten (W), and combinations thereof. The metal vias and contacts generally employ an adhesion layer such as titanium nitride (TiN) and/or titanium (Ti) to adhere the metal layer to the $SiO_2$ substrate. At the contact level, the adhesion layer acts as a diffusion barrier to prevent the filled metal and $SiO_2$ from reacting.

In one semiconductor manufacturing process, metallized vias or contacts are formed by a blanket metal deposition followed by a chemical mechanical polish (CMP) step. In a typical process, via holes are etched through an interlevel dielectric (ILD) to interconnection lines or to a semiconductor substrate. Next, a thin adhesion layer such as titanium nitride and/or titanium is generally formed over the ILD and is directed into the etched via hole. Then, a metal film is blanket deposited over the adhesion layer and into the via hole. Deposition is continued until the via hole is filled with the blanket deposited metal. Finally, the excess metal is removed by chemical mechanical polishing, (CMP) to form metal vias. Processes for manufacturing and/or CMP of vias are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force, is maintained against the substrate back. An abrasive and chemically reactive solution, commonly referred to as a "slurry" is applied to the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion and erosion. Furthermore, the polishing slurry may be used to provide controlled polishing selectivities to other thin-film materials used in current integrated circuit technology such as titanium, titanium nitride and the like.

Typically CMP polishing slurries contain an abrasive material, such as silica or alumina, suspended in an oxidizing, aqueous medium. For example, U.S. Pat. No. 5,244,534 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium that is useful for polishing aluminum. U.S. Pat. No. 5,340,370 to Cadien et al. discloses a tungsten polishing slurry comprising approximately 0.1M potassium ferricyanide, approximately 5 weight percent silica and potassium acetate. Acetic acid is added to buffer the pH at approximately 3.5.

U.S. Pat. No. 4,789,648 to Beyer et al. discloses a slurry formulation using alumina abrasives in conjunction with sulfuric, nitric, and acetic acids and deionized water. U.S. Pat. Nos. 5,391,258 and 5,476,606 disclose slurries for polishing a composite of metal and silica which includes an aqueous medium, abrasive particles and an anion which controls the rate of silica removal. Other polishing slurries for use in CMP applications are described in U.S. Pat. No. 5,527,423 to Neville et al., U.S. Pat. No. 5,354,490 to Yu et al., U.S. Pat. No. 5,157,876 to Medellin, U.S. Pat. No. 5,137,544 to Medellin, and U.S. Pat. No. 4,956,313 to Cote et al.

There are various mechanisms disclosed in the prior art by which metal surfaces can be polished with slurries. The metal surface may be polished using a slurry in which a surface film is not formed in which case the process proceeds by mechanical removal of metal particles and their dissolution in the slurry. In such a mechanism, the chemical dissolution rate should be slow in order to avoid wet etching. A more preferred mechanism is, however, one where a thin abradable layer is continuously formed by reaction between the metal surface and one or more components in the slurry such as a complexing agent and/or a film forming layer. The thin abradable layer is then removed in a controlled manner by mechanical action. Once the mechanical polishing process has stopped a thin passive film remains on the surface and controls the wet etching process. Controlling the chemical mechanical polishing process is much easier when a CMP slurry polishes using this mechanism.

Efforts to develop copper CMP slurries are disclosed in the literature. The RPI effort (J. M. Steigerwald et al, *Electrochemical Potential Measurements during the Chemical-Mechanical Polishing of Copper Thin Films*, Mat. Res. Soc. Symp. 337, 133 (1994)) is focused on the use of ammonium compounds (ammonium nitrate, chloride, hydroxide), nitric acid, and alumina abrasive. Copper dissolution of 2 nm/min (as measured electrochemically) is assumed to proceed from a film-free surface. Polishing rates, however, are reported to be in excess of 400 nm/min. The discrepancy is explained by importance given to the mechanical action, forming Cu debris, which is then dissolved by solution. Selectivity factors are not given.

Q. Luo et al, *Chemical-Mechanical Polishing of Copper in Acidic Media*, Proceedings—First International Chemical-Mechanical Polish (CMP) for VLSI/LSI Multilevel Interconnection Conference (CMP-MIC), Santa Barbara, Feb. 22–23, 1996 discloses using a CMP slurry including a very aggressive etchant, Fe-nitrate, pH 1–2, in combination with an inhibitor (benzotriazole), a slurry stabilizing surfactant (poly-ethylene-glycol) and alumina. The chemical reaction is apparently controlled by a formation of a corrosion inhibiting film, namely Cu-BTA, with surfactant undermining its protectiveness. Selectivity to oxide is given as 15:1 to 45:1.

CMP electrochemical work at Sematech laboratories is disclosed in R. Carpio et al, *Initial Study On Copper CMP Slurry Chemistries*, Thin Solid Films, 262 (1995). The reference explores the use of electrochemistry in the fundamental characterization of plausible slurries. In addition to several others, potassium permanganate is used as a slurry oxidizer.

H. Hirabayashi et al, *Chemical Mechanical Polishing of Copper Using A Slurry Composed of Glycine and Hydrogen Peroxide*, Proceedings—First International Chemical-Mechanical Polish (CMP) for VLSI/LSI Multilevel Interconnection Conference (CMP-MIC), Santa Barbara, Feb. 22–23, 1996, and Japanese Kokai Patent Application No. 8 (1996) 83780 disclose a mixture of glycine, hydrogen peroxide and silica, with or without benzotriazole, for the CMP process of Cu with a low corrosion rate and defect level. The references disclose that CMP slurries incorporating a chemical agent, such as benzotriazole and n-benzoyl-n-phenylhydroxylamine form a protective film on copper. The removal rate varies, depending on the concentration of slurry components. An optimized rate of 120 nm/min was reported, with TiN rate of 30 nm/min and dishing of 200 nm across the 15 μm wide structures.

In the course of polishing substrates using slurries including passivating agents such as benzotriazole (BTA), it has been discovered that reaction of BTA with the copper surface during polishing produces a surface film which is very resistant to the mechanical action of the abrasive, making removal of the surface film difficult. Furthermore, the degree of passivation is time dependent and not easy to control making automation of substrate polishing processes difficult. In addition, BTA undergoes oxidative degradation. Thus, a slurry containing BTA and an oxidizer has a short useful pot life that limits manufacturing usefulness. These properties of passivating agents, such as BTA, make it difficult to use machines to polish passivated substrates in a reproducible manner.

Despite the desirability of using passivating agents in a film forming mechanism in CMP process, there remains problems with formulating CMP slurries that are able to control the thickness of the passivating layer of film formed as well as problems ensuring that the film formed is abradable. These problems can result in film forming CMP slurries that exhibit unacceptably low polishing rates or poor polishing results. Thus, a need remains for a CMP slurry that is capable of forming a removable thin passive layer on a substrate surface, and more particularly on the surface of a copper alloy containing substrate. A desireable CMP slurry will exhibit good thin film polishing selectivities and simultaneously give polished substrates with minimal dishing and low defectivity.

SUMMARY OF THE INVENTION

The present invention is directed to a chemical mechanical polishing slurry that is able to polish metal containing substrates at reproducible and acceptable rates.

In addition, the chemical mechanical polishing slurries of this invention have low insulator polishing selectivities while exhibiting high polishing selectivities towards copper and copper alloy containing metal layers.

Furthermore, this invention is directed to methods for using a single chemical mechanical polishing slurry to polish metal layers and particularly copper or copper alloy containing layers in an integrated circuit.

In one embodiment, this invention is a chemical mechanical polishing slurry. The slurry includes an abrasive, at least one oxidizer, and a complexing agent selected from the group of compounds including citric acid, lactic acid, tartaric acid, succinic acid, malonic acid, oxalic acids, amino acids and salts thereof. The slurry does not include a film forming agent.

In another embodiment, this invention is a chemical mechanical polishing slurry. The slurry includes an abrasive, an oxidizing agent selected from the group consisting of hydrogen peroxide, urea hydrogen peroxide, and mixtures thereof, and tartaric acid. The chemical mechanical polishing slurry has a pH of from about 5.0 to about 9.0, however, no film-forming agent is present in the slurry.

In still another embodiment, this invention is a method for polishing a substrate including at least one metal layer. Polishing is accomplished by admixing, from about 1.0 to about 15.0 weight percent of an abrasive, from about 0.3 to about 15.0 weight percent of an oxidizer, from about 0.5 to about 5.0 weight percent of at least one complexing agent, and deionized water to give a chemical mechanical polishing slurry. No film-forming agent is added to the slurry. Next, the chemical mechanical polishing slurry is applied to the substrate and at least a portion of the metal layer is removed from the substrate by bringing a pad into contact with the substrate and moving the pad in relation to the substrate.

In yet another embodiment, this invention is a multi-package system useful for preparing a chemical mechanical polishing slurry. The multi-package system includes a first container including a complexing agent and a second container comprising an oxidizing agent. An abrasive material may be located in a container selected from the group consisting of the first container, the second container, or a third container.

DESCRIPTION OF THE CURRENT EMBODIMENT

The present invention relates to a chemical mechanical polishing composition precusor and to a chemical mechanical polishing slurry that is effective even without a film-forming agent. The chemical mechanical polishing slurry comprises an abrasive and the precursor. The precursor includes at least one oxidizer and a complexing agent wherein the oxidizer and complexing agent are selected and formulated in amounts sufficient to inhibit dissolution of the surface of the substrate being polished. The chemical mechanical polishing slurry is useful for polishing metals, especially copper and copper alloy containing metal layers associated with a substrate selected from the group including integrated circuits, thin films, multiple level semiconductors, and wafers.

Before describing the details of the various preferred embodiments of this invention, some of the terms that are used herein will be defined. The chemical mechanical polishing slurry, ("CMP slurry"), is a useful product of this invention that comprises an oxidizer, an abrasive, a complexing agent, and other optional ingredients. However, the CMP slurry does not include a film forming agent. The CMP slurry is useful for polishing a multiple level metallizations which may include but are not limited to, semi-conductor thin-films, integrated circuit thin-films, and for any other films and surfaces where CMP processes are useful. The terms "copper" and "copper containing alloys" are used interchangeably herein as it is within the understanding of one of skill in the art that the terms include, but are not limited to, substrates comprising layers of pure copper, copper aluminum alloys, and Ti/TiN/Cu, and Ta/TaN/Cu multi-layer substrates.

The CMP slurry of this invention includes at least one oxidizer. The oxidizer aids in oxidizing the substrate metal layer or layers to their corresponding oxide, hydroxide, or ions. For example, in the present invention, the oxidizer may be used to oxidize a metal layer to its corresponding oxide or hydroxide, e.g., titanium to titanium oxide, tungsten to tungsten oxide, copper to copper oxide, tantalum to tantalum oxide, and aluminum to aluminum oxide. The oxidizing agent is useful when incorporated into a CMP slurry to polish metals and metal based components including titanium, titanium nitride, tantalum, tantalum nitride, copper, tungsten, aluminum, and aluminum alloys such as aluminum/copper alloys, and various mixtures and combinations thereof by mechanically polishing the metals to remove the respective oxide layer.

The oxidizer used in the CMP slurry of this invention may be selected from compounds, which, upon reduction, form hydroxyl radicals. Such oxidizers exhibit good polishing selectivity towards metal and metal containing substrate layers and particularly towards copper alloy layers. Non-exclusive examples of metal oxidizing compounds that, upon reduction, form hydroxyl radicals include peracetic acid, urea-hydrogen peroxide, urea peroxide, and hydrogen peroxide and mixtures thereof, with hydrogen peroxide, urea hydrogen peroxide, and mixtures thereof being preferred oxidizers.

The oxidizer may be present in the chemical mechanical polishing slurry in an amount ranging from about 0.3 to about 30.0 weight percent. It is preferred that the oxidizer is present in the CMP slurry of this invention in an amount ranging from about 0.3 to about 17.0 weight percent and most preferably from about 1.0 to about 12.0 weight percent.

In another embodiment, the oxidizer is urea hydrogen peroxide. Because urea hydrogen peroxide is 34.5 wt % hydrogen peroxide and 65.5 wt % urea, a greater amount by weight of urea hydrogen peroxide must be included in CMP slurries of this invention to achieve the desired oxidizer loading set forth above. For example, a range of 1.0 to 12.0 weight percent oxidizer corresponds to a urea hydrogen peroxide weight three times as great or from 3.0 to 36.0 weight percent.

A CMP slurry comprising urea hydrogen peroxide can be formulated by a number of methods including combining urea peroxide with water, and by combining urea and hydrogen peroxide in an aqueous solution in a mole ratio range of from about 0.75:1 to about 2:1 to give a urea hydrogen peroxide oxidizer.

The CMP slurry of this invention differentiates itself from other CMP slurries, and especially from CMP slurries useful for polishing copper layers, in that it does not include a separate film forming agent in addition to the oxidizing agent. Examples of such separate film-forming agents that are omitted from the compositions of this invention include cyclic compounds such as imidazole, benzotriazole, benzimidazole and benzothiazole. A separate film forming agent is omitted from the precursor and slurry compositions of this invention in order to avoid difficulties encountered in controlling the depth of and subsequently removing the corrosion inhibiting layers formed by separate film-forming agents.

During chemical mechanical polishing, it is important to inhibit dissolution of the substrate surface layer in order to minimize surface defectively. One class of compounds found to be useful in combination with oxidizing agents to control surface dissolution are complexing agents. Useful complexing agents include, but are not limited to, acids such as citric, lactic, tartaric, succinic, acetic, malonic oxalic and other acids and salts thereof such as ammonium tartarate, as well as amino acid and amino sulfuric acids and their salts. Preferred complexing agents are tartaric acid, citric acid, malonic acid, and mixtures thereof with tartaric acid being most preferred.

The complexing agents serve to form a complex with the oxidized metal and not the underlying unoxidized metal thereby limiting the depth of the oxidized layer. The complexing agent will be present in the CMP slurry of this invention in an amount ranging from about 0.1 to about 5.0 weight percent, and preferably in an amount ranging from about 0.5 to about 3.0 weight percent.

It is desirable to maintain the pH of the CMP slurry of this invention within a range of from about 2.0 to about 12.0, preferably between from about 5.0 to about 9.0 and most preferably from about 6.5 to about 7.5 in order to facilitate control of the CMP process. Slurry handling problems and substrate polishing quality problems are encountered when the pH of the CMP slurry of this invention is too low, e.g., less than 2. When tartaric acid is selected as the complexing agent, the CMP slurry will have a pH of about 2.0 and pH adjustment to a higher level is necessary.

The pH of the CMP slurries of this invention may be adjusted using any known acid, base, or amine. However, the use of an acid or base that contains no metal ions, such as ammonium hydroxide and amines, or nitric, phosphoric, sulfuric, or organic acids are preferred to avoid introducing undesirable metal components into the CMP slurry of this invention.

In order to promote stabilization of a CMP slurry of this invention against settling, flocculation, and decomposition, a variety of optional CMP slurry additives, such as surfactants, stabilizers, or dispersing agents, can be used. If a surfactant is added to the CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects.

In general, the amount of optional additives such as a surfactant that are used in the present invention should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. On the other hand, too much surfactant in the CMP slurry may result in undesirable foaming and/or flocculation in the slurry. As a result, stabilizers such as surfactants should generally be present in the slurry of this invention in an amount ranging from about 0.001% to about 0.2% by weight, and preferably from about 0.001 to about 0.1 weight percent. Furthermore, the additive may be added directly to the slurry or treated onto the surface of the metal oxide abrasive utilizing known techniques. In either case, the amount of additive is adjusted to achieve the desired concentration in the polishing slurry. Preferred surfactants include dodecyl sulfate sodium salt, sodium lauryl sulfate, dodecyl sulfate ammonium salt, and mixtures thereof. Examples of useful surfactants include TRITON® DF-16 manufactured by Union Carbide, and SURFYNOL® manufactured by Air Products and Chemicals.

The CMP slurry of this invention includes an abrasive. The abrasive is typically a metal oxide abrasive. The metal oxide abrasive may be selected from the group including alumina, titania, zirconia, germania, silica, ceria and mixtures thereof. The CMP slurry of this invention preferably includes from about 1.0 to about 15.0 weight percent or more of an abrasive. It is more preferred, however, that the CMP slurry of this invention includes from about 2.0 to about 6.0 weight percent abrasive.

The metal oxide abrasive may be produced by any techniques known to those skilled in the art. Metal oxide abrasives can be produced using any high temperature process such as sol-gel, hydrothermal or plasma process, or by processes for manufacturing fumed or precipitated metal oxides. Preferably, the metal oxide is a fumed or precipitated abrasive and more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e. de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$ and preferably from about 30 $m^2/g$ to about 170 $m^2/g$. Due to stringent purity requirements in the IC industry, the preferred metal oxide should be of a high purity. High purity means that the total impurity content, from sources such as raw material impurities and trace processing contaminants, is typically less than 1% and preferably less than 0.01% (i.e., 100 ppm).

The metal oxide abrasive useful in the slurry of this invention may consist of metal oxide aggregates or individual single sphere particles. The term "particle" as it is used herein refers to both aggregates of more than one primary particle and to individual single particles.

It is preferred that the metal oxide abrasive consists of metal oxide particles having a size distribution less than about 1.0 micron, (i.e., all particles are less than 1.0 micron in diameter), a mean particle diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The particle size distribution in the present invention may be determined utilizing known techniques such as transmission electron microscopy (TEM). The mean particle diameter refers to the average equivalent spherical diameter when using TEM image analysis, i.e., based on the cross-sectional area of the particle. By force is meant that either the surface potential or the hydration force of the metal oxide particles must be sufficient to repel and overcome the van der Waals attractive forces between the particles.

In another preferred embodiment, the metal oxide abrasive may consist of discrete, individual metal oxide particles having a primary particle diameter less than 0.4 micron (400 nm) and a surface area ranging from about 10 $m^2/g$ to about 250 $m^2/g$.

Preferably, the metal oxide abrasive is incorporated into the aqueous medium of the polishing slurry as a concentrated aqueous dispersion of metal oxides, comprising from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically achieved by subjecting the aqueous solution of metal oxide to high shear mixing conditions known to those skilled in the art. The pH of the dispersion may be adjusted away from the isoelectric point to a pH of about 4.0 in order to maximize colloidal stability. The dispersion is typically diluted with deionized water and other slurry ingredients during CMP slurry preparation. A most preferred metal oxide abrasive is SEMI-SPERSE® W-A355 fumed alumina dispersion manufactured by Cabot Corporation. W-A355 is a 9 wt % fumed alumina dispersion having a pH of about 4.0.

Although the CMP slurry of this invention may be used to polish any type of metal layer, the chemical mechanical polishing slurry of this invention has been found to have a high copper, titanium, titanium nitride, and tantalum nitrate and acceptable tantalum polishing rates. In addition, the chemical mechanical polishing slurry exhibits desirable low polishing rates towards the dielectric insulating layer.

The CMP slurry of this invention may be produced using conventional techniques known to those skilled in the art. Typically, the oxidizing agent and other non-abrasive components, are mixed into an aqueous medium, such as deionized or distilled water, at predetermined concentrations under low shear conditions until such components are completely dissolved in the medium. A concentrated dispersion of the metal oxide abrasive, such as fumed alumina, is added to the medium and diluted to the desired loading level of abrasive in the final CMP slurry.

The CMP slurries of the present invention may be supplied as one package system (oxidizing agent, abrasive, and complexing agent in a stable aqueous medium). To avoid possible CMP slurry degradation, it is preferred that at least a two package system is used where the first package comprises the complexing agent, abrasive dispersion, and any optional additives, and the second package comprises an oxidizer. Other two-container combinations of the ingredients of the CMP slurry of this invention are within the knowledge of one having ordinary skill in the art.

CMP slurries of this invention can be formulated by combining one or more complexing agents with one or more metal oxide abrasives and deionized water to give a oxidizer free containing CMP precursor. Formulating CMP slurries of this invention from a slurry precursor eliminates stability, shipping and safety concerns associated with hydrogen peroxide containing slurries. This is because the oxidizer free CMP precursor can also be prepared and shipped to the location where it will be used and then mixed with an oxidizing agent such as hydrogen peroxide on site to give a CMP slurry.

An optional slurry precursor of this invention will comprise an aqueous mixture of urea, at least one complexing agent, and at least one metal oxide abrasive. Additional ingredients, other than a film forming agent, may be incorporated into the urea containing slurry precursor.

A most preferred slurry precursor of this invention includes an aqueous dispersion of fumed alumina, a complexing agent selected from ammonium oxalate, tartaric acid, ammonium tartarate or mixtures thereof, and preferably tartaric acid, and a surfactant in quantities disclosed above. The slurry precursor or mixtures thereof, will preferably have a pH of from about 5.0 to about 9.0.

A multi-package CMP slurry system may be used with any standard polishing equipment appropriate for use on the desired metal layer of the wafer. The multi-package system includes one or more CMP slurry components in, where appropriate, aqueous or dry form in two or more containers. The multi-package system is used by combining the components from the various containers in the desired amounts to give a CMP slurry comprising at least one oxidizing agent, a complexing agent, and at least one abrasive in the amounts described above, prior to or at the time of the slurry to a substrate. The preferred package system comprises a first container including a CMP slurry precursor comprising alumina, urea, a complexing agent selected from ammonium oxalate, tartaric acid, ammonium tartarate and mixtures thereof, and a surfactant at a pH from about 5.0 to about 8.0 and a second container including hydrogen peroxide. At the polishing location, a preselected amount of the CMP precursor and a selected amount of hydrogen peroxide are combined at the time of polishing to give a CMP slurry of this invention.

The CMP slurry of the present invention does not significantly increase the silicon dioxide polishing rate. However, the CMP slurry of this invention polishes copper, titanium, titanium nitride, tantalum, and tantalum nitride layers at good rates under controllable conditions. Thus, the CMP slurry of this invention is effective in controlling polishing selectivities of titanium, copper, titanium nitride, tantalum, and tantalum nitride layers. The polishing slurry of the present invention may be used during the various stages of semiconductor integrated circuit manufacture to provide effective polishing at desired polishing rates while minimizing surface imperfections and defects.

EXAMPLES

We have discovered that a film-forming-agent-free CMP slurry including at least one abrasive, at least one oxidizer, and complexing agent of specific types and amounts is capable of polishing multiple metal layers comprising copper alloys, titanium, and titanium nitride, tantalum and tantalum nitride at high rates while exhibiting good selectivity towards dielectric layers.

The following examples illustrate preferred embodiments of this invention as well as preferred methods for using compositions of this invention.

Example I

This Example evaluates the dissolution and corrosion of copper in the presence of CMP slurries with and without the film forming agent BTA. The rate of Cu dissolution during the CMP process is deducted from electrochemical measurements. Most of the electrochemical data are obtained ex situ (i.e. not on the polishing table) using a device consisting of a Cu rotating disk electrode (with a rotator by Pine) and 273 Pontentiostat with Corrosion Software (by EG&G, PAR). A platinum mesh electrode serves as an auxiliary electrode, and a saturated mercurous sulfate electrode (MSE) is used as the reference electrode. Electrochemical data are obtained with a preselected electrode rotation of 500 rpm (or 19.94 m/sec., maximum) with the rotator and the electrode in a contact with an abrasive pad (with a down force of 1.2 kg or 5.9 psi) or raised above the pad.

The device can measure the metal dissolution as the metal surface is abraded (or polished on the polishing tool) as well as after abrasion. The abrasion value is considered to be an approximate measure of the chemical rate during polishing, while the measurements following abrasion give the corrosion rate of the metal in a given slurry. Typically, electrochemical data are recorded as potentiodynamic polarization curves, with the potential swept from about −0.25 V cathodic to the open circuit potential to some anodic potential, by a rate of 10 mV/sec.

Each of the slurries evaluated had a pH of 7.0. The alumina used in the slurries was SEMI-SPERSE® W-A355 fumed alumina dispersion, manufactured by Cabot Corporation and diluted to the desired loading level. The copper dissolution rate, measured with the device as a current density, was re-calculated in terms of Å/min and is listed for several slurries in Table I.

TABLE I

| Slurry | Cu Dissolution rate with abrasion, A/min | Cu corrosion rate (after abrasion) A/min |
| --- | --- | --- |
| 1  3% alumina, 2% $H_2O_2$, 50 ppm Triton DF-16 and 0.04% BTA | 4.8 | 0.2 |
| 2  Same as 1 but w/o BTA | 24 | 4.8 |
| 3  3% alumina, 2% $H_2O_2$, 1% amm. oxalate, 50 ppm Triton DF-16 and 0.04% BTA | 96 | 1.4 |
| 4  Same as 3 but w/o BTA | 2,400 | 60 |

TABLE I-continued

| Slurry | Cu Dissolution rate with abrasion, A/min | Cu corrosion rate (after abrasion) A/min |
|---|---|---|
| 5 3% alumina, 2% $H_2O_2$, 1% tartaric acid, 3.65% urea, 50 ppm Triton DF-16 and 0.04% BTA | 96 | 1.1 |
| 6 Same as in 5 but w/o BTA | 240 | 24 |

The results show that the rate of Cu dissolution during and after abrasion is relatively low using slurries containing only $H_2O_2$ (and a surfactant), as the Cu surface is passivated with Cu-oxide (slurry 2). Additions of BTA to $H_2O_2$ result in additional surface film with Cu dissolution rate with and without abrasion in a single digits (slurry 1). Upon additions of a strong complexing agent, such as ammonium oxalate to the slurries, Cu dissolution rate with abrasion is 100 times higher (compare slurry 2 and 4) than in peroxide alone, while Cu corrosion rate increases from about 5 to 60 Å/min. The use of a film forming agent such as BTA, decreases the Cu dissolution rate to 96 Å/min with abrasion and 1.4 Å/min after abrasion, respectively. With tartaric acid, slurries 5 and 6, the dissolution rate of Cu with or without abrasion, with or without BTA, is still relatively low. Thus, with this complexing agent, the passivation ability of the oxidizer is not significantly effected, and the film forming agent, BTA, is not needed to limit the Cu corrosion rate.

Example II

This Example evaluates the ability of CMP slurries with and without 0.04 wt % BTA film forming agent to polish various substrate layers. Each slurry included 2.0 wt % $H_2O_2$, 1.0 wt % tartaric acid, 3.0 wt % of SEMI-SPERSE® W-A355 fumed alumina dispersion manufactured by Cabot Corporation, and 50 ppm Triton DF-16. The pH of each slurry was adjusted to 7.0 using $NH_4OH$ prior to use.

Each CMP slurry was applied to PVD copper wafers having a Ti, TiN or Ta underlayer on and IPEC 472 polisher and polished using a perforated IC1000/SUBA IV pad stack manufactured by Rodel, Inc. at 3 psi down force, a table speed of 55 rpm and a spindle speed of 30 rpm and a back pressure of 0.8 psi. The polishing data are reported in Table II below.

TABLE II

| | WITH BTA | | WITHOUT BTA | |
|---|---|---|---|---|
| Performance Parameter | Performance w/TiN | Performance w/Ta | Performance w/TiN | Performance w/Ta |
| Cu Polishing rate | 3000–8000 Å/min | 3000–8000 Å/min | 3639 Å/min | 5600 Å/min |
| Cu WIWNU | 4.7 (15%) | | 5.6% | 7.9% |
| Selectively to Ti | 1.5 and higher | | 1.8:1 | |
| Selectively to TiN | 1.5:1 | | 1.5:1 | |
| Selectively to Ta | | 13:1 | | 12:1 |
| Selectively to TaN | | 7:1 | | 8:1 |
| Selectively to $SiO_2$ | >100:1 | >100:1 | >100:1 | >100:1 |
| Dishing (150 μm) | 1145 Å | | | |
| Dishing (100 μm) | | 2900 Å (15% over-polishing) | 850 Å | 1100 Å |
| Dishing (50 μm) | 577 Å | | 650 Å | 1200 Å |
| Dishing (20 μm) | | | 290 Å | 290 Å |
| Dishing (15 μm) | 483 Å | 1250 Å (15% over-polish) | 255 Å | 400 Å |
| Erosion | | | | |
| Post CMP particle count (no oxide buffing | | | | <50 particle/wafer (with 0.2 micron threshold) |
| Cu (in E10) on PETEOS | | | | nd to 80 |
| PETEOS surface roughness | | | <0.30 nm rms (using AFM) | |
| Time to clear patterned wafer with 1.6 μm Cu | | | <4 min | |

The results show that the polishing performance in the slurries with and without BTA is comparable, and slightly improved in the slurry without BTA when dishing and erosion are considered.

Example III

Removal rates of Cu, Ta and glass were determined in this Example using slurries with different concentrations of $H_2O_2$ and tartaric acid, at pH 7.0. The abrasive used in each slurry was SEMI-SPERSE® W-A355 fumed alumina dispersion manufactured by Cabot Corporation. The polishing results are reported in Table 3. PVD Cu wafers were polished using an IPEC 472 tool at a down force of 3 psi, a back pressure of 0.6 psi, a platen speed of 55 rpm, and a carrier speed of 30 rpm.

TABLE III

| Slurry | Cu removal rate Å/min | Ta removal rate Å/min | PETEOS removal rate Å/min |
|---|---|---|---|
| 1 3% alumina, 2.5% $H_2O_2$, 1.25% tartaric acid, 3.65% urea, 50 ppm Triton DF-16 | 2396 | 434 | 77 |
| 2 5% alumina, 5% $H_2O_2$, 0.7% tartaric acid, 3.65% urea, 50 ppm Triton DF-16 | 1025 | 432 | 78 |
| 3 2% alumina, 5% $H_2O_2$, 0.3% tartaric acid, 3.65% urea, 50 ppm Triton DF-16 | 807 | 408 | 135 |

The results set forth in Table III show that the higher the weight ratio of the peroxide to tartaric acid, the smaller the Cu removal rate (i.e. the better the passivation).

The present invention is a CMP slurry precursor and slurry manufactured therefrom that has no film-forming agent, and, instead comprises an abrasive, at least one oxidizing agent, and at least one complexing agent. CMP slurries of this invention are able to polish metal layers in a controlled manner by forming a reproducibly thin passivating layer. As a result, less variability is introduced into the polishing process, the polishing performance of the slurry is more consistent and controllable, the polishing results are good, and the shelf life of the product is increased.

While the present invention has been described by means of specific embodiments, it will be understood that modifications may be made without departing from the spirit of the invention. The scope of the invention is not to be considered as limited by the description of the invention set forth in the specification and examples, but rather as defined by the following claims.

What we claim is:

1. A chemical mechanical polishing slurry comprising:
   an abrasive;
   at least one oxidizer; and
   from about 0.1 to 5.0 wt % of a complexing agent wherein the slurry does not include a film-forming agent.

2. The chemical mechanical polishing slurry of claim 1, wherein the complexing agent is selected from the group consisting of citric acid, lactic acid, tartaric acid, succinic acid, acetic acid, malonic acid, oxalic acid, amino acids, amino sulfuric acids, salts thereof, and mixtures thereof.

3. The chemical mechanical polishing slurry of claim 2, wherein the complexing agent is selected from the group consisting of tartaric acid, lactic acid, citric acid, acetic acid, amino acids, and combinations thereof.

4. The chemical mechanical polishing slurry of claim 1, wherein the complexing agent is present in an amount ranging from 0.5 to about 3.0 weight percent.

5. The chemical mechanical polishing slurry of claim 1, wherein the oxidizer is a compound that forms hydroxyl radicals upon reduction.

6. The chemical mechanical polishing slurry of claim 5, where the oxidizing agent is hydrogen peroxide.

7. The chemical mechanical polishing slurry of claim 1, wherein the oxidizing agent is present in the composition in an amount ranging from about 0.3 to about 17 weight percent.

8. The chemical mechanical polishing composition of claim 1, wherein the weight ratio of oxidizing agent to complexing agent ranges from about 2 to about 16.67.

9. The chemical mechanical polishing slurry of claim 1, having a pH of from about 5 to about 9.

10. The chemical mechanical polishing slurry of claim 1, wherein the abrasive is at least one metal oxide.

11. The chemical mechanical polishing slurry of claim 1, wherein the abrasive is selected from the group consisting of silica, alumina, and mixtures thereof.

12. The chemical mechanical polishing slurry of claim 11, wherein the abrasive is colloidal silica.

13. The chemical mechanical polishing slurry of claim 11, wherein the abrasive is fumed alumina.

14. The chemical mechanical polishing slurry of claim 1, including at least one surfactant.

15. A chemical mechanical polishing slurry comprising: an abrasive; an oxidizing agent; and from about 0.1 to about 5.0 wt % tartaric acid, wherein the slurry does not include a film-forming agent.

16. The chemical mechanical polishing slurry of claim 15, wherein the oxidizing agent is hydrogen peroxide.

17. The chemical mechanical polishing slurry of claim 15, wherein the tartaric acid is present in the slurry in an amount ranging from about 0.5 to about 3.0 weight percent.

18. The chemical mechanical polishing slurry of claim 15, wherein the abrasive is at least one metal oxide.

19. The chemical mechanical polishing slurry of claim 18, wherein the metal oxide abrasive consists of metal oxide aggregates having a size distribution less than about 1.0 micron and a mean aggregate diameter less than about 0.4 micron.

20. The chemical mechanical polishing slurry of claim 18, wherein the metal oxide abrasive consists of discrete, individual metal oxide spheres having a primary particle diameter less than 0.4 micron and a surface area ranging from about 10 $m^2/g$ to about 250 $m^2/g$.

21. The chemical mechanical polishing slurry of claim 15, wherein the abrasive is selected from the group consisting of silica, alumina, and mixtures thereof.

22. The chemical mechanical polishing slurry of claim 21 wherein the abrasive is selected from the group consisting of colloidal silica and fumed alumina.

23. A chemical mechanical polishing slurry comprising:
   from about 1.0 to about 15.0 weight percent of an abrasive selected from silica, alumina and mixtures thereof
   from about 1.0 to about 12.0 weight percent hydrogen peroxide; and
   from about 0.1 to about 5.0 weight percent tartaric acid, wherein the slurry does not include a film-forming agent, and wherein the weight ratio of hydrogen peroxide to tartaric acid ranges from about 2 to about 16.67.

24. The chemical mechanical polishing slurry of claim 23, including at least one surfactant.

25. The chemical mechanical polishing slurry of claim 23, wherein the weight ratio of hydrogen peroxide to tartaric acid ranges from about 2 to about 7.14.

26. The chemical mechanical polishing slurry of claim 23, having a pH of about 5 to about 9.

27. The chemical mechanical polishing slurry of claim 23, wherein the abrasive is colloidal silica.

28. The chemical mechanical polishing slurry of claim 23, wherein the abrasive is fumed alumina.

* * * * *